US006838655B2

(12) United States Patent
Heimlicher

(10) Patent No.: US 6,838,655 B2
(45) Date of Patent: Jan. 4, 2005

(54) PHOTOELECTRIC PROXIMITY SWITCH

(75) Inventor: Peter Heimlicher, Freiburg (CH)

(73) Assignee: Optosys S.A. (CH)

( * ) Notice: Subject to any disclaimer, the term of this patent is extended or adjusted under 35 U.S.C. 154(b) by 7 days.

(21) Appl. No.: 10/309,656

(22) Filed: Dec. 4, 2002

(65) Prior Publication Data

US 2003/0116699 A1 Jun. 26, 2003

(30) Foreign Application Priority Data

Dec. 4, 2001 (EP) .............................. 01811175

(51) Int. Cl.$^7$ .......................... G06M 7/00; H01J 40/14
(52) U.S. Cl. ................... 250/221; 250/222.1; 340/556
(58) Field of Search ..................... 250/214 R, 214 C, 250/214 AL, 214 LS, 221, 222.1; 327/514; 356/221–223, 226; 340/555–557

(56) References Cited

U.S. PATENT DOCUMENTS 5,243,182 A * 9/1993 Murata et al. ........... 250/222.1
5,250,801 A   10/1993 Grozinger et al. ...... 250/223 B
6,455,839 B1 * 9/2002 O'Connor et al. .......... 250/221

FOREIGN PATENT DOCUMENTS

DE   4031142    4/1992
DE   19926214   1/2001

* cited by examiner

*Primary Examiner*—Stephone B. Allen
*Assistant Examiner*—Patrick J. Lee
(74) *Attorney, Agent, or Firm*—Ostrolenk, Faber, Gerb & Soffen, LLP

(57) ABSTRACT

Photoelectric proximity switch for detecting the presence of an object in a monitored area. A light pulse transmitter emits transmitting light pulses into the monitored area. The pulses are triggered by an output signal of a random signal generator or a pseudo-random signal generator and are emitted with a time interval between them. A light receiver is arranged in relation to the light pulse transmitter and to the monitored area such that in the absence of an object to be detected in the monitored area, the receiver receives essentially no light from the light pulse transmitter, but in the presence of an object to be detected in the monitored area, it receives such light from the light pulse transmitter due to reflection that a receiving signal evaluating device connected to the light receiver and to random signal generator or the pseudo-random signal generator delivers an object detection signal.

17 Claims, 3 Drawing Sheets

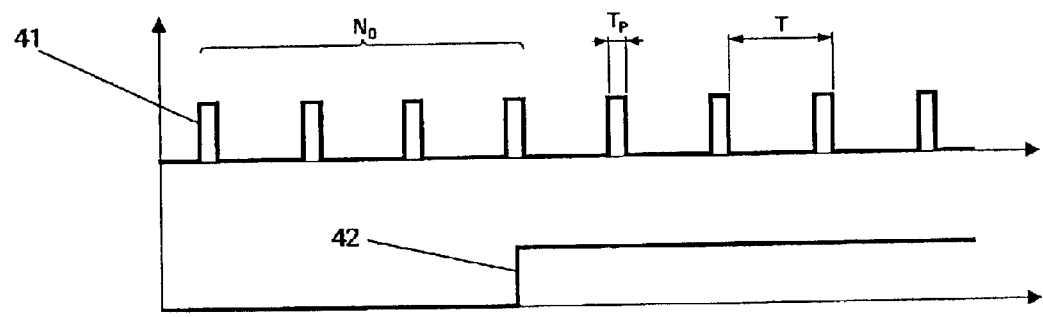
PRIOR ART   Fig. 1
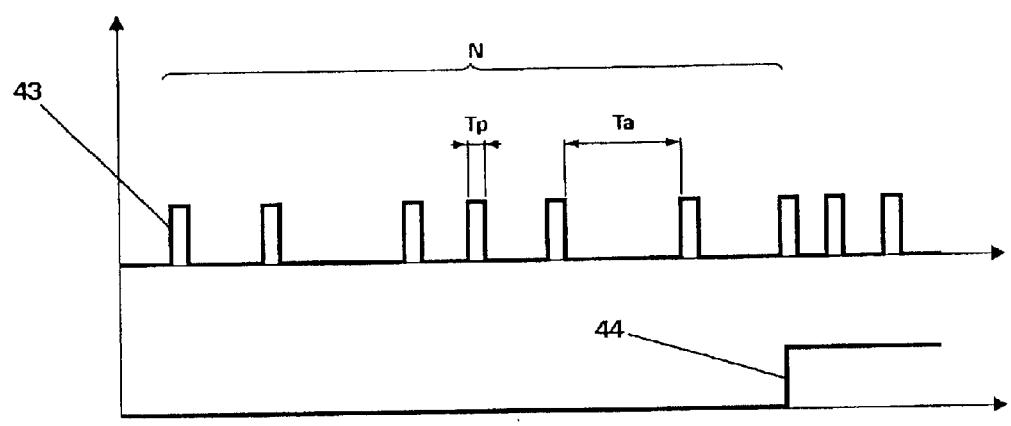
Fig. 2

PHOTOELECTRIC PROXIMITY SWITCH

FIELD OF THE INVENTION

The invention refers to a photoelectric proximity switch for detecting the presence of an object in a monitored area, the photoelectric proximity switch comprising a light pulse transmitter for emitting transmitting light pulses into the monitored area that are triggered by an output signal of a pulse generator and emitted with a time interval between each of them, and a light receiver arranged in relation to the light pulse transmitter and to the monitored area in such a manner that in the absence of an object to be detected in the monitored area, it receives essentially no light from the light pulse transmitter, but in the presence of an object to be detected in the monitored area, it receives such an amount of light from the light pulse transmitter due to reflection that a receiving signal evaluating device connected to the light receiver delivers an object detection signal.

The invention further refers to a system for detecting the presence of objects in a monitored area.

The invention also refers to a method for detecting the presence of an object in a monitored area by means of a photoelectric proximity switch of the above-mentioned kind.

BACKGROUND OF THE INVENTION

Light is widely used as a medium for the transmission of information. Light has many advantages over other media, such as its independence from exterior magnetic or electric fields, its high propagation speed, large ranges, the possibility of shaping the ray beam by simple optical arrangements, etc. Furthermore, very efficient electronic components for generating and detecting light are available today. In addition, the latter distinguish themselves by a practically unlimited lifetime, a large bandwidth, and cost efficiency.

The main problem in the use of light for signal transmission is often that when more than one transmitter-receiver pair is used in the same room, each receiver may receive light from different transmitters, and the receiving device is unable to determine by which transmitter the received light has been emitted.

The light transmission from a transmitter to a receiver may take place directly or through a reflection or multiple reflections. This problem can be solved in that the light emitted by each transmitter is provided with additional information, which is evaluated and used for identification by the receivers. Many ways of achieving this are known, e.g. by associating a given wavelength and/or polarization to the light emitted by each transmitter, or by using different kinds of modulation resp. codes, as well as combinations thereof. The modulation of the emitted light is particularly interesting from the technical point of view, but it has the disadvantage of reducing the overall available bandwidth in all circumstances.

The above-mentioned problem is especially pronounced e.g. in photoelectric proximity switches. The latter are mainly used in the fields of manufacture, conveyance, and storage. Increasingly exacting demands with respect to these installations lead to a continuously increasing number of sensors in a limited space, thereby resulting in a higher probability of undesirable mutual interference between different transmitter-receiver pairs. It is therefore desirable to provide the user with transmitter-receiver pairs that can be used at will without requiring particular precautions. Transmitter-receiver pairs requiring preparatory measures in order to be individually identifiable are particularly unsuitable as they involve in particular more complicated logistics and an increased risk of errors in the installation of replacement parts.

Also, a signal connection of the different transmitter-receiver pairs is generally unacceptable because of the additional wiring.

For an improved signal-to-noise ratio and a reduced sensitivity to ambient light, photoelectric proximity switches of the prior art mainly use pulse modulated transmitting light pulses 41 as those shown in FIG. 1.

In addition, for improved switching security resp. reliability, the receiving device is designed to await a certain number $N_0$ of received pulses before triggering a change of state of output signal 42 of the receiving device. Such a change of state signals the presence of a detected object in the monitored area. Fundamentally, this allows to reduce the risk of mutual interference between adjacent transmitter-receiver pairs as well. However, as the pulse frequency of all devices of a given manufacturing series is approximately but not exactly the same on account of component tolerances, a coincidence of the phase relation and thus an undesirable mutual interference may nevertheless occur from time to time.

German Patent No. DE 40 31 142 C 2 discloses a method where each transmitter-receiver pair ascertains whether light from an adjacent transmitter-receiver pair is currently impinging on its receiver before emitting a light pulse. If this is the case, the emission of the transmitting light pulse is delayed until the light receiver no longer receives external light, and only then is a light pulse emitted. However, this method of the prior art has several drawbacks. As the transmitting light pulses cannot be delayed for too long, the achieved operation is unsatisfactory particularly if more than two devices are used at the same time. Moreover, the operation of the method disclosed in the reference DE 40 31 142 C 2 is unreliable if transmitting light pulses are emitted by two or more devices exactly simultaneously, which is unavoidable from time to time due to the unsynchronized operation.

Other methods of the prior art make use of complicated modulations resp. codes. For example, German Patent Application No. DE 199 26 214 A 1 discloses a method where a modulation is even used in conjunction with a correlation analysis. This method of the prior art is also subject to considerable drawbacks. A major disadvantage is the time required for calculating the correlation, but also the unreliability of the obtained result. In fact, depending on the determined threshold value of the correlation function, the probability of error pulses is higher or lower while the time consumption is inversely proportional.

SUMMARY OF THE INVENTION

It is therefore a first object of the invention to provide a photoelectric proximity switch of the kind mentioned in the introduction that allows a reliable detection of the presence of an object in a monitored area also when a large number of such photoelectric proximity switches are simultaneously used in a room where each light receiver may receive light from more than one light transmitter as well as stray light.

The just mentioned first object shall preferably be attained in such a manner that a reliable detection of the presence of an object in a monitored area is possible without requiring measures for an individual identification of the photoelectric proximity switches, without impairing the other capabilities of the photoelectric proximity switches, more particularly their switching frequency and current consumption, and without causing substantially increased costs.

Furthermore, a second object of the invention is to provide a system for detecting the presence of objects in a monitored area that eliminates the drawbacks discussed above.

Furthermore, the third object of the invention is to provide a method for detecting the presence of an object in a monitored area by means of a photoelectric proximity switch of the above-mentioned kind that eliminates the drawbacks discussed above.

The advantages obtained by the invention mainly consist in that the above-mentioned objects are attained in an advantageous manner, and in that it allows a reliable operation of a large number of photoelectric proximity switches arranged in a restricted space also in the presence of stray light.

According to the invention, the above-mentioned first object is attained by a photoelectric proximity switch according to claim 1.

According to the invention, the above-mentioned second object is attained by a system according to claim 11.

According to the invention, the above-mentioned third object is attained by a method according to claim 12.

Preferred embodiments of the invention are defined in dependent claims.

BRIEF DESCRIPTION OF THE DRAWINGS

Embodiments of the invention are described by way of examples with reference to the accompanying drawings, where FIG. 1 shows a diagram of the temporal position of transmitting light pulses 41 and of the output signal 42 of the receiving signal evaluating device of a photoelectric proximity switch of the prior art, FIG. 2 shows a diagram of the temporal position of transmitting light pulses 43 and of the output signal 44 of the receiving signal evaluating device of a photoelectric proximity switch according to the invention.

DETAILED DESCRIPTION OF THE PREFERRED EMBODIMENTS

Figure 3:
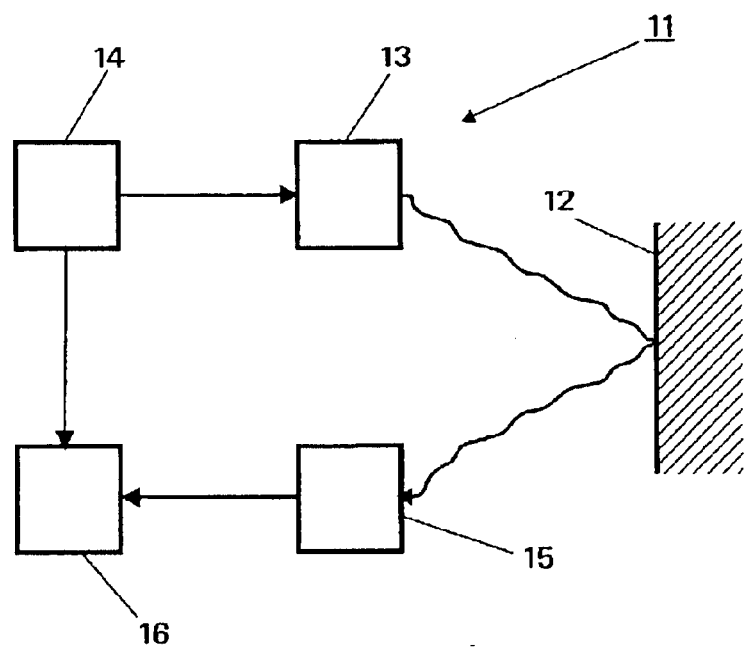
FIG. 3 shows the block circuit diagram of a photoelectric proximity switch according to the invention.

Exemplary Embodiments of a Photoelectric Proximity Switch According to the Invention As appears in FIG. 3, a photoelectric proximity switch 11 for detecting the presence of an object 12 in a monitored area comprises the following components resp. functional blocks: a light pulse transmitter 13, a pulse generator 14, a light receiver 15, and a receiving signal evaluating device 16. Pulse generator 14 is preferably a random signal generator.

Light pulse transmitter 13 emits transmitting signal pulses into the monitored area that are triggered by pulse generator 14 and emitted with a time interval between each of them.

Light receiver 15 is arranged in relation to light pulse transmitter 13 and to the monitored area in such a manner that in the absence of an object 12 to be detected in the monitored area, it receives essentially no light from light pulse transmitter 13, but in the presence of a detected object in the monitored area, it receives such an amount of light from light pulse transmitter 13 due to reflection that a receiving signal evaluating device 16 connected to light receiver 15 delivers an object detection signal.

A first output of random signal generator 14 is connected to an input of light pulse transmitter 13, which is thus supplied with a first signal serving for determining the position of the transmitting light pulses emitted by light pulse transmitter 13.

A second output of random signal generator 14 is connected to an input of receiving signal evaluating device 16, which is thus supplied with a second output signal of random signal generator 14 that is identical to the first output signal of the random signal generator or corresponds to it.

By means of the output signal delivered by random signal generator 14, an evaluating device 16 ascertains the validity of the received light pulses. The transmitting pulse sequence 43 according to FIG. 2, which is transmitted by each transmitter, is pulse-position modulated by the output signal of random signal generator 14. Consequently, the pulse sequence is modulated at random. This is obtained in that transmitter 13, instead of transmitting at a fixed transmitting frequency F resp. a fixed period T, transmits at a mean transmitting frequency Fa resp. a mean period Ta and a pulse duration Tp.

Random signal generator 14 is preferably designed such that any periodicity of its output signal is excluded or at least very improbable, also during its starting phase.

As follows from the preceding discussion, the different light pulse transmitters are completely desynchronized, as far as possible, in order to reduce the probability of a mutual interference between different transmitter-receiver pairs located in a common optical room to a level where such interference is practically excluded. In this respect, the present approach clearly differs from an approach attempting to reach the same aim by a synchronization of the different transmitters being as precise as possible, however with a controlled phase shift between the light pulses emitted by the different transmitters.

Figure 4:
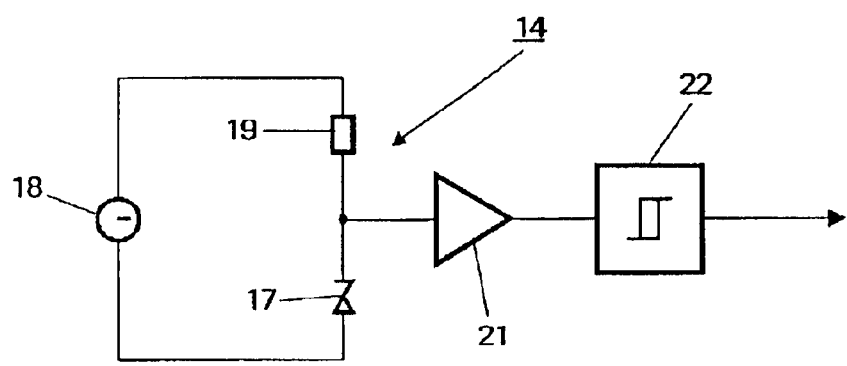
FIG. 4 shows a first exemplary embodiment of the random signal generator 14 of FIG. 3.

Random signal generator 14 is very simple in design and makes e.g. use of the natural, i.e. essentially white noise. By way of example, FIG. 4 shows the circuit diagram of a random signal generator 14 in the form of a noise signal generator where a Zener diode 17, e.g. of the type BZX84C6V2, is used as a noise source, thereby generating essentially white noise. This noise signal generator comprises the connection in series of a DC voltage source 18 delivering e.g. a voltage of 10 Volt, of a resistor 19 of e.g. 470 Ohms, and of Zener diode 17. The noise signal across load resistance 19 of Zener diode 17 is amplified in an amplifier 21 and transformed into a square signal in pulse shaper 22.

In a second embodiment of a photoelectric proximity switch according to the invention, random signal generator 14 is in the form of a pseudo-random signal generator.

In the context of the present invention, the pseudo-random signal generator may be e.g. in the form of a so-called digital noise generator serving as a pulse generator 14. A pseudo-random signal generator of this kind comprises e.g. a shift register in feedback with exclusive OR-gates.

However, a pseudo-random signal generator is less suitable for random signal generation than a noise signal generator as its output signal will always have a certain periodicity.

Figure 5:
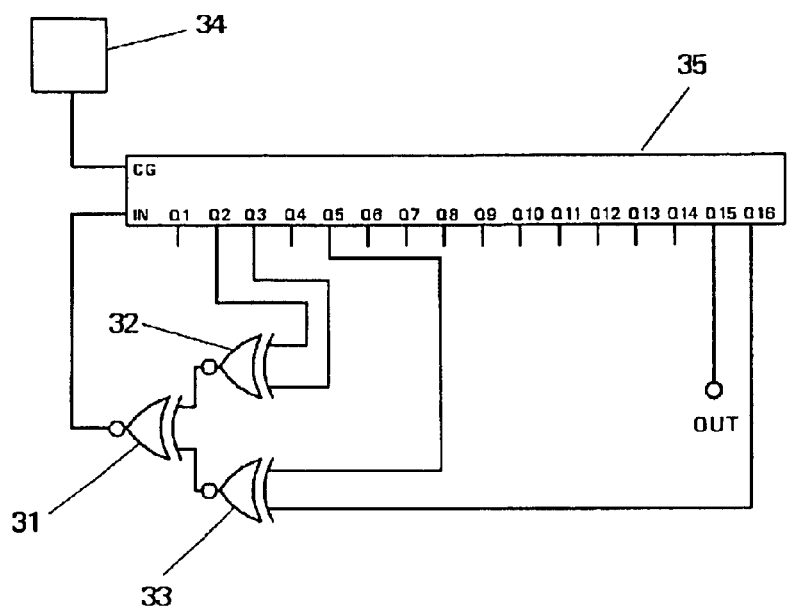
FIG. 5 shows a second exemplary embodiment of the random signal generator 14 of FIG. 3.

FIG. 5 shows a typical embodiment of a pseudo-random signal generator where exclusive OR-gates 31, 32, 33 are connected to parallel outputs Q2, Q3, Q5, and Q16 of a shift register 35 which is clocked by a clock generator 34 at its input IN, such that the polynomial function $$f(x)=1+x^2+x^3+x^5+x^{16}$$

is serially available at its output OUT. This function resembles a random pulse sequence. However, it is not a random function but recurs with a period of $2^n$ clock pulses of clock generator 34 (where n is the number of flip-flops of the shift register).

For practical reasons, it is advantageous to limit the range of values of the variable interval between successive transmitting pulses generated by means of the random or pseudo-random signal generator serving as pulse generator 14. Too short intervals are disadvantageous, as they would cause an overload of the transmitting diode and a too short recovery time of the receiver. Too long intervals are also disadvantageous because they would cause dropouts in evaluating device 16. Thus, random or pseudo-random signal generator 16 is preferably operated in such a manner that the length of the randomly distributed intervals between successive transmitting light pulses generated therein is comprised in a predetermined range defined by a minimum and maximum limit.

A first embodiment of evaluating device 16 takes account of the following facts:

Pulse collisions may occur even if randomly modulated signals are used. In addition, the occurrence of such collisions increases with the number M of transmitters located in the same room. Therefore, by effecting an evaluation of a series of N pulses on the receiver side by means of evaluating device 16, it is ensured that the overall collision probability decreases below the value required for the particular application. Thus, the reception of a number N of valid signals in an uninterrupted succession is required for triggering a change of state of the output signal of the receiver, the change of state being equivalent to an object detection signal. In this context, each received pulse will be considered as valid that has essentially the same temporal position as a corresponding transmitted light pulse, however independently of whether the pulse has indeed been emitted by the transmitter associated to receiver 15, which cannot be determined by evaluating device 16.

Additional transmitting pulses, i.e. transmitting pulses that do not coincide with the transmitting pulses emitted by the transmitter associated to the receiver of a transmitter-receiver pair, are not evaluated. Known methods of probability calculus and statistics show that the collision probability $P_1$ can be calculated by the following formula:

$$P_1 = \frac{c\binom{N-A}{A*(M-2)}}{c\binom{N}{A*(M-1)}}$$

where $$A=T_p*N*F_a$$

C means the combination of ( ) and is given by $$c\binom{a}{b} = \frac{a!}{b!(a-b)!}$$

If M, Tp, and Fa are defined, N may be chosen such that the desired collision probability is obtained. The latter can be chosen as low as desired (except zero). However, if N is increased, the useful switching frequency is reduced correspondingly. Therefore, a compromise between the switching frequency, M, Tp, Fa, and N must be chosen in each case. For example, if M=5, Tp=1 microsecond, Fa=15 kHz, and N=500, a collision probability of $1.25*10^{-17}$ results, or of one event in 1,270,000 years, and a switching frequency of 1 kHz.

A preferred alternative embodiment of evaluating device 16 takes account of the fact that it is possible in practice that not all transmitted pulses are successfully received, e.g. due to electric disturbances or to noise in the input stage. In order to take account of this possibility, an alternative embodiment of evaluating device 16 deviates from the above-mentioned condition (uninterrupted sequence of N pulses) by accepting, in the pulse sequence N, a number K of missing pulses that should be present according to the above condition. However, in order to maintain a given collision probability, the original value of N must be increased to a higher value Nk if K>0.

In this embodiment of evaluating device 16, for triggering a change of state of the output signal of the receiver, which change of state is an object detection signal, Nk light pulses must be received, of which Nk−K pulses must be accepted as valid by evaluating device 16, wherein K is a positive integer and K=Nk−N. Each pulse is accepted as valid that essentially has the same temporal position as a corresponding transmitted light pulse.

In the just described operation mode of evaluating device 16, it can be demonstrated that the collision probability $P_2$ can be calculated by the following formula:

$$P_2 = \frac{\sum_{i=0}^{A-K} c\binom{A}{i} * c\binom{N_K - A}{A*(M-2)+i}}{c\binom{N_K}{A}}$$

The just described operation mode has the advantage that errors which are e.g. due to electric noise can be met in an effective and relatively easy way. The photoelectric proximity switch in this operation mode can be adjusted to a specific application by fixing M, Tp, Fa and K in order to obtain the desired switching frequency and collision probability and thus can be operated in a wide range of applications even under rugged conditions. In particular, a reliable operation of the photoelectric proximity switch is guaranteed, even if some of the transmitted pulses are not successfully received.

In the above-described methods, a number N resp. Nk of pulses must be awaited in order to allow a change of the output signal of the device. The useful switching frequency of the photoelectric proximity switch is correspondingly reduced, so that the resulting value of the switching frequency may be too low for certain applications. However, as mentioned above, the simple devices that are used today generally also count a number $N_0$ of valid pulses before effecting a change of the output signal of the device. Therefore, the useful signal frequency is reduced in the devices of the prior art already.

In preferred embodiments of the proximity switch according to the invention, an undesired reduction of the switching frequency is counteracted by the following measures:
1. The pulse duration Tp of the transmitted light pulses is reduced while maintaining the mean modulation frequency Fa. With the available components, a reduction of Tp, whose typical values are currently approx. in the range of 2 to 10 microseconds, to less than 2 microsecond or even less than 1 microsecond is possible without any problems. A reduction of the pulse width by half reduces the required value for N to less than half (for the same collision probability).
2. If evaluating device 16 detects a short sequence of e.g. Ns valid pulses and a change of state of the output signal of evaluating device is therefore probable, the modulation frequency Fa of the following N–Ns resp. Nk–Ns pulses is strongly increased, e.g. doubled (burst). The time required for attaining N resp. Nk is thereby correspondingly reduced without influencing the collision probability.
3. Evaluating device 16 is used for the permanent surveillance of foreign pulses emitted by other transmitters rather than the own one. In the case of no or a small number of external pulses, N resp. Nk may be dynamically reduced with a resulting increase of the useful switching frequency.

Thus, the present invention offers a method providing a very significant reduction of the interference between adjacent devices over the prior art. The possible applications of such devices are therefore substantially enlarged, and their application is simplified.

Exemplary Embodiment of a System According to the Invention

Figure 6:
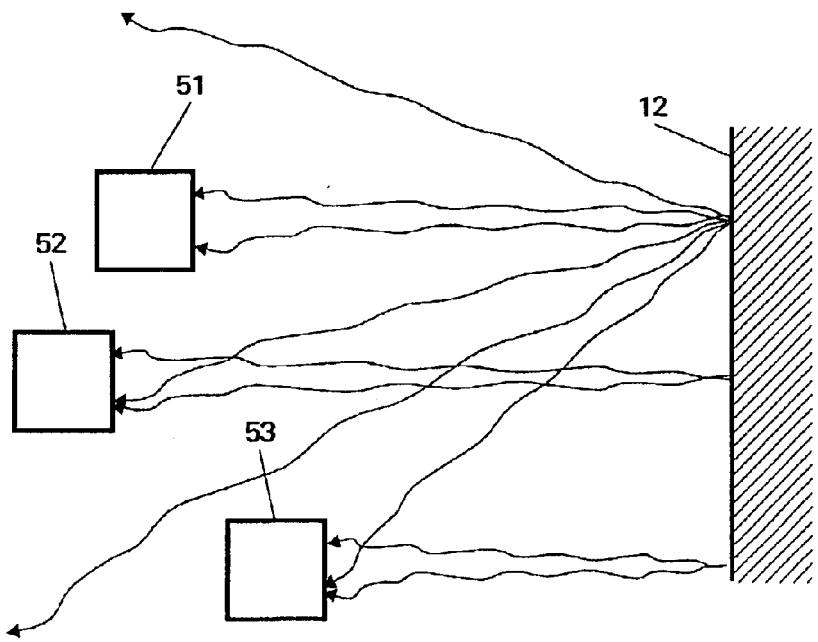
FIG. 6 shows a schematic view of a system comprising a plurality of photoelectric proximity switches according to the invention.

FIG. 6 schematically shows a system including a plurality of photoelectric proximity switches 51, 52, 53, etc. according to the invention and serving e.g. for detecting the presence of an object 12 in a monitored area. The design and functionality of each photoelectric proximity switch 51, 52, 53, etc. may correspond to one of the above-described embodiments.

Exemplary Embodiment of a Method According to the Invention

In the implementation of the method according to the invention for detecting the presence of an object 12 in a monitored area, e.g. one of the above-described embodiments of a photoelectric proximity switch is used. To this end,
(a) the pulse sequence of the transmitting light pulses emitted by the light pulse transmitter (13) is pulse-position modulated by means of a first output signal of a random signal generator or pseudo-random signal generator serving as a pulse generator, and
(b) a second output signal of the random signal generator that is identical to the first output signal of the random signal generator or pseudo-random signal generator or that corresponds thereto is used for controlling the operation of the receiving signal evaluating device (16).

In a first embodiment of the just defined method, the light pulses received by light receiver 15 are processed in an evaluating device that delivers an object detection signal when light receiver 15 receives an uninterrupted sequence of N light pulses, each of the N received pulses having essentially the same temporal position as a corresponding transmitted light pulse.

In a second embodiment of the just defined method, the light pulses received by light receiver 15 are processed in an evaluating device that delivers an object detection signal when light receiver 15 receives a sequence of Nk light pulses, each of a number Nk–K of the received light pulses having essentially the same temporal position as a corresponding transmitted light pulse, while K is a positive integer and K=Nk–N.

For an increased switching frequency, the method comprises the application of the following measures individually or in combination:
  the use of transmitting light pulses having a pulse duration (Tp) of less than two microseconds,
  increasing the mean pulse frequency (Fa) of the transmitting light pulses emitted by light pulse transmitter 13 over selected time intervals if the number of light pulses received in a receiving interval and accepted as valid by an evaluating device is smaller than a predetermined value.

In the context of the present invention, all light wavelengths can be taken into consideration, i.e. visible light as well as infrared and ultraviolet radiation.

Although preferred embodiments of the invention have been described above using specific terms, such description is for illustrative purposes only, and it is to be understood that changes and variations may be made without departing from the spirit or scope of the claims of this patent.

LIST OF REFERENCE NUMERALS 11 photoelectric proximity switch
12 object
13 light pulse transmitter
14 pulse generator/random signal generator/pseudo-random signal generator/noise signal generator
15 light receiver
16 receiving signal evaluating device
17 Zener diode
18 DC voltage source
19 resistor
21 amplifier
22 pulse shaper
31 exclusive-OR gate
32 exclusive-OR gate
33 exclusive-OR gate
34 clock generator
35 shift register
41 pulse-modulated transmitting light pulses
42 output signal of receiving device
43 pulse-modulated sequence of transmitting light pulses
44 output signal of evaluating device
51 transmitter-receiver pair
52 transmitter-receiver pair
53 transmitter-receiver pair
F frequency of transmitted light pulses
T period of transmitted light pulses
Fa mean value of frequency of transmitted light pulses
Ta mean value of period of a transmitted light pulse
M number of light pulse transmitters located in the same room
$N_0$ number of received light pulses (prior art)
N number of received light pulses (first embodiment of evaluating device)
Nk number of received light pulses (second embodiment of evaluating device)
Ns number of received light pulses (third embodiment of evaluating device)
K positive integer
P1 collision probability
P2 collision probability

What is claimed is:

1. Photoelectric proximity switch for detecting the presence of an object in a monitored area, the photoelectric proximity switch comprising:
   a pulse generator comprising a random signal generator or a pseudo-random signal generator, which generates a first output signal at a first output and a second output signal at a second output, the second output signal being identical or corresponding to the first output signal;
   a light pulse transmitter for emitting transmitting light pulses into the monitored area that are emitted with a time interval between each of them, the light pulse transmitter having an input being connected to the first output of the pulse generator for supplying the light pulse transmitter with the first output signal triggering the transmitting light pulses and determining the pulse position of the transmitting light pulses;
   a receiving signal evaluating device having an input being connected to the second output of the pulse generator for supplying the receiving signal evaluating device with the second output signal; and
   a light receiver arranged in relation to the light pulse transmitter and to the monitored area in such a manner that in the absence of an object to be detected in the monitored area, the light receiver receives essentially no light from the light pulse transmitter, but in the presence of an object to be detected in the monitored area, the light receiver receives such an amount of light from the light pulse transmitter due to reflection that the receiving signal evaluating device delivers an object detection signal.

2. Photoelectric proximity switch according to claim 1, wherein the random signal generator is a noise signal generator.

3. Photoelectric proximity switch according to claim 2, wherein the noise signal generator generates essentially white noise.

4. Photoelectric proximity switch according to claim 1, wherein the random signal generator or the pseudo-random signal generator is operable so that the length of randomly distributed intervals between successive transmitting light pulses generated by the generator is comprised in a predetermined range defined by a minimum and maximum limit.

5. Photoelectric proximity switch according to claim 1, wherein the receiving signal evaluating device comprises an evaluating unit that delivers an object detection signal when the light receiver receives an uninterrupted sequence of N light pulses, each of the N received pulses essentially having the same temporal position as a corresponding transmitted light pulse.

6. Photoelectric proximity switch according to claim 1, wherein the receiving signal evaluating device comprises an evaluating unit that delivers an object detection signal when the light receiver receives a sequence of Nk light pulses, each of a number Nk−K of the received light pulses having essentially the same temporal position as a corresponding transmitted light pulse while K is a positive integer.

7. Photoelectric proximity switch according to claim 1, wherein the light pulse transmitter is operable such that each of the emitted transmitting light pulses has a pulse duration of less than two microseconds.

8. Photoelectric proximity switch according to claim 1, wherein the light pulse transmitter is operable such that the mean pulse frequency of the emitted transmitting light pulses can be increased over selected time intervals.

9. Photoelectric proximity switch according to claim 1, further comprising means for detecting and evaluating stray pulses.

10. Photoelectric proximity switch according to claim 1, wherein the evaluating device is operable for permanent surveillance of stray pulses emitted by other transmitters than the light pulse transmitter and for dynamically reducing the number of pulses that have to be received in order to deliver an object detection signal when the number of stray pulses falls below a minimum value.

11. System for detecting the presence of objects in a monitored area, comprising a plurality of photoelectric proximity switches, at least one of said photoelectric proximity switches comprising:
   a pulse generator comprising a random signal generator or a pseudo-random signal generator, which generates a first output signal at a first output and a second output signal at a second output, the second output signal being identical or corresponding to the first output signal;
   a light pulse transmitter for emitting transmitting light pulses into the monitored area that are emitted with a time interval between each of them, the light pulse transmitter having an input being connected to the first output of the pulse generator for supplying the light pulse transmitter with the first output signal triggering the transmitting light pulses and determining the pulse position of the transmitting light pulses;
   a receiving signal evaluating device having an input being connected to the second output of the pulse generator for supplying the receiving signal evaluating device with the second output signal; and
   a light receiver arranged in relation to the light pulse transmitter and to the monitored area in such a manner that in the absence of an object to be detected in the monitor area, the light receiver receives essentially no light from the light pulse transmitter, but in the presence of an object to be detected in the monitored area, the light receiver receives such an amount of light from the light pulse transmitter due to reflection that the receiving signal evaluating device delivers an object detection signal.

12. Method for detecting the presence of an object in a monitored area by a photoelectric proximity switch comprising:
   generating a first output signal by a pulse generator which is a random signal generator or a pseudo-random signal generator;
   emitting transmitting light pulses by a pulse transmitter, with a time interval between pulses, into the monitored area, the transmitting light pulses being pulse-position modulated by the first output signal of the pulse generator;
   receiving light pulses in such a manner than in the absence of an object to be detected in the monitored area, essentially no light pulses are received from the light pulse transmitter, but in the presence of an object to be detected in the monitored area, light pulses are received from the light pulse transmitter due to reflection;
   generating a second output signal by the pulse generator that is identical or corresponds to the first output signal; and
   evaluating the received light pulses using the second output signal.

13. Method according to claim 12, further comprising delivering an object detection signal when an uninterrupted sequence of N light pulses is received, each of the N received pulses essentially having the same temporal position as a corresponding light pulse transmitted by the pulse transmitter.

14. Method according to claim 12, further comprising delivering an object detection signal when a sequence of Nk light pulses is received, each of number Nk−K of the received light pulses essentially having the same temporal position as a corresponding light pulse transmitted by the pulse transmitter while K is a positive integer.

15. Method according to claim 12, wherein each one of the transmitting light pulses has a pulse duration of less than two microseconds.

16. Method according to claim 12, further comprising increasing the mean pulse frequency of the transmitting light pulses over selected time intervals if the number of light pulses received in a receiving interval and accepted as valid by the evaluating step is smaller than a predetermined value.

17. Method according to claim 12, wherein the evaluating comprises permanently monitoring stray pulses emitted other than the transmitted light pulses and dynamically reduces the number of pulses that have to be received in order to deliver an object detection signal when the number of stray pulses falls below a minimum value.

* * * * *